(12) United States Patent
Hasnain et al.

(10) Patent No.: US 11,428,371 B2
(45) Date of Patent: Aug. 30, 2022

(54) LED-BASED REPLACEMENT FOR FLUORESCENT LIGHT SOURCE

(71) Applicant: BRIDGELUX, INC., Fremont, CA (US)

(72) Inventors: Ghulam Hasnain, Livermore, CA (US); Calvin B. Ward, Castro Valley, CA (US)

(73) Assignee: BRIDGELUX, INC., Fremont, CA (US)

( * ) Notice: Subject to any disclaimer, the term of this patent is extended or adjusted under 35 U.S.C. 154(b) by 224 days.

(21) Appl. No.: 16/779,447

(22) Filed: Jan. 31, 2020

(65) Prior Publication Data

US 2020/0248879 A1 Aug. 6, 2020

Related U.S. Application Data

(63) Continuation of application No. 16/195,692, filed on Nov. 19, 2018, now Pat. No. 10,551,008, which is a
(Continued)

(51) Int. Cl.
*F21K 9/275* (2016.01)
*F21V 29/89* (2015.01)
(Continued)

(52) U.S. Cl.
CPC ............ *F21K 9/275* (2016.08); *F21K 9/27* (2016.08); *F21K 9/272* (2016.08); *F21V 19/001* (2013.01);
(Continued)

(58) Field of Classification Search
CPC . F21K 9/275; F21K 9/272; F21K 9/27; F21V 29/10; F21V 19/001; F21V 29/89;
(Continued)

(56) References Cited

U.S. PATENT DOCUMENTS 7,794,114 B2 9/2010 Medendorp, Jr.
7,815,338 B2 10/2010 Siemiet et al.
(Continued)

FOREIGN PATENT DOCUMENTS

| JP | 2006032729 | 2/2006 |
|---|---|---|
| JP | 2006074028 | 3/2006 |
| WO | 2009101561 A1 | 8/2009 |

OTHER PUBLICATIONS

International Search Report dated Apr. 10, 2012 from related International Application No. PCT/US2011/051551.
(Continued)

*Primary Examiner* — Minh D A
(74) *Attorney, Agent, or Firm* — ArentFox Schiff LLP

(57) ABSTRACT

A light source that is adapted to replace existing fluorescent tubes in an existing fluorescent light fixture is disclosed. The light source includes a plurality of LEDs mounted on a heat-dissipating structure, first and second plug adapters that mate with the florescent tube connectors of the fluorescent tube the light source is to replace, and a power adapter that converts power from a fluorescent tube ballast presented on the first and second plug adapters to DC power that powers the LEDs. The light source is powered from the output of the existing fluorescent ballast. The light source can utilize the existing metallic enclosure as a heat-radiating surface and/or direct air heat transfer from the surface of the heat-dissipating structure.

23 Claims, 7 Drawing Sheets

Related U.S. Application Data continuation of application No. 15/423,529, filed on Feb. 2, 2017, now Pat. No. 10,132,450, which is a continuation of application No. 14/180,351, filed on Feb. 13, 2014, now Pat. No. 9,599,287, which is a continuation of application No. 12/888,111, filed on Sep. 22, 2010, now Pat. No. 8,668,361.

(51) Int. Cl.

| | | |
|---|---|---|
| *F21V 29/70* | (2015.01) | |
| *F21K 9/27* | (2016.01) | |
| *F21V 29/10* | (2015.01) | |
| *F21K 9/272* | (2016.01) | |
| *F21V 19/00* | (2006.01) | |
| *F21Y 103/10* | (2016.01) | |
| *F21Y 115/10* | (2016.01) | |
| *H05K 1/02* | (2006.01) | |

(52) U.S. Cl.
CPC .............. *F21V 29/10* (2015.01); *F21V 29/70* (2015.01); *F21V 29/89* (2015.01); *F21Y 2103/10* (2016.08); *F21Y 2115/10* (2016.08); *H05K 1/0209* (2013.01); *H05K 2201/10106* (2013.01); *Y02B 20/30* (2013.01)

(58) Field of Classification Search
CPC ..... F21V 29/70; Y02B 20/30; F21Y 2103/10; F21Y 2115/10; H05K 1/0209; H05K 2201/10106
See application file for complete search history.

(56) References Cited

U.S. PATENT DOCUMENTS

| | | | |
|---|---|---|---|
| 7,926,975 B2 | 4/2011 | Siemiet et al. | |
| 7,938,562 B2 | 5/2011 | Ivey et al. | |
| 7,946,729 B2 | 5/2011 | Ivey et al. | |
| 7,976,196 B2 | 7/2011 | Ivey et al. | |
| 8,668,361 B2 * | 3/2014 | Hasnain .................. | F21K 9/27 362/294 |
| 9,588,287 B2 | 3/2017 | Hoshino | |
| 9,599,287 B2 * | 3/2017 | Hasnain ................ | F21V 19/001 |
| 10,132,450 B2 * | 11/2018 | Hasnain .................. | F21V 29/89 |
| 10,551,008 B2 * | 2/2020 | Hasnain .................. | F21V 29/10 |
| 2003/0048641 A1 | 3/2003 | Alexanderson et al. | |
| 2005/0190553 A1 | 9/2005 | Lynch et al. | |
| 2006/0076672 A1 | 4/2006 | Petroski | |
| 2006/0193131 A1 | 8/2006 | McGrath et al. | |
| 2007/0223225 A1 | 9/2007 | Eiich et al. | |
| 2008/0019120 A1 | 1/2008 | Rapisarda | |
| 2008/0094837 A1 | 4/2008 | Dobbins et al. | |
| 2008/0192508 A1 | 8/2008 | Busby | |
| 2009/0226656 A1 | 9/2009 | Crandell et al. | |
| 2009/0273924 A1 | 11/2009 | Chiang | |
| 2009/0290352 A1 | 11/2009 | Wu et al. | |
| 2009/0303720 A1 | 12/2009 | McGrath | |
| 2009/0323349 A1 | 12/2009 | Ochiai | |
| 2010/0019689 A1 | 1/2010 | Shan | |
| 2010/0033095 A1 | 2/2010 | Sadwick | |
| 2010/0073931 A1 | 3/2010 | Watanabe | |
| 2010/0103678 A1 * | 4/2010 | Van De Ven ......... | F21V 7/0008 362/294 |
| 2010/0140578 A1 | 6/2010 | Tian et al. | |
| 2010/0320896 A1 | 12/2010 | Pet et al. | |
| 2011/0211756 A1 | 5/2011 | Thomas et al. | |
| 2011/0279063 A1 | 11/2011 | Wang et al. | |
| 2012/0068622 A1 | 3/2012 | Ward | |

OTHER PUBLICATIONS

Written Opinion dated Apr. 10, 2012 from related International Application No. PCT/US2011/051551.
Preliminary Report on Patentability dated Apr. 10, 2012 from related International Application No. PCT/US2011/051551.
Notification Concerning Transmittal of International Preliminary Report on Patentability, International Search Report and Written Opinion in International Application No. PCT/US2011/051551 dated Apr. 4, 2013.
Preliminary Examination Decision in corresponding Taiwanese Invention Patent Application No. 100133889, and dated Jun. 22, 2016.

* cited by examiner

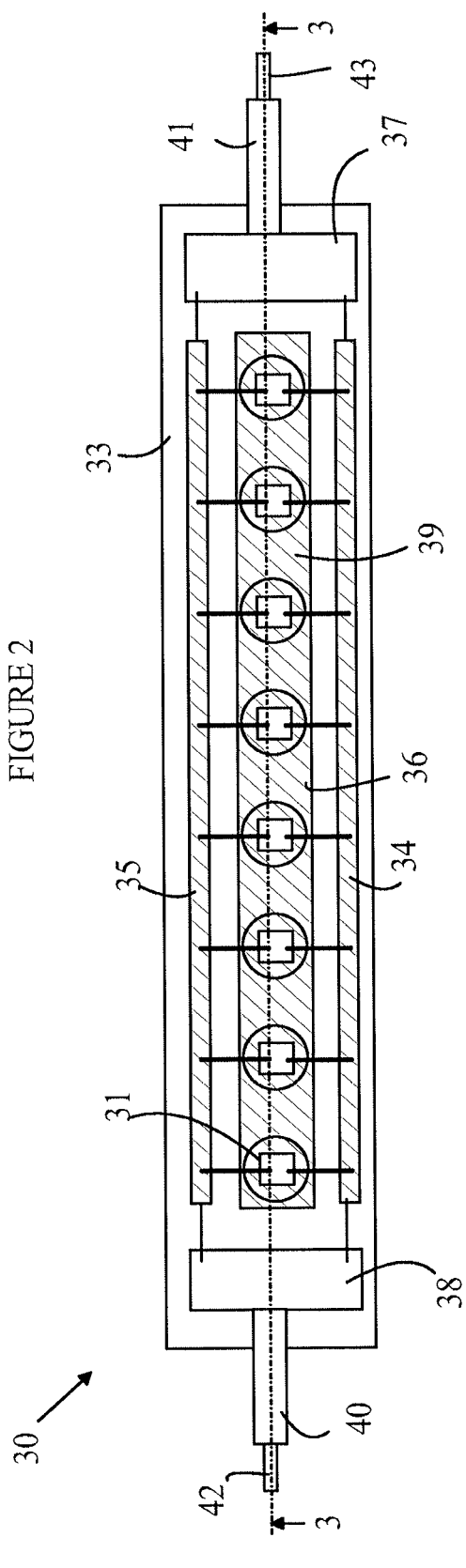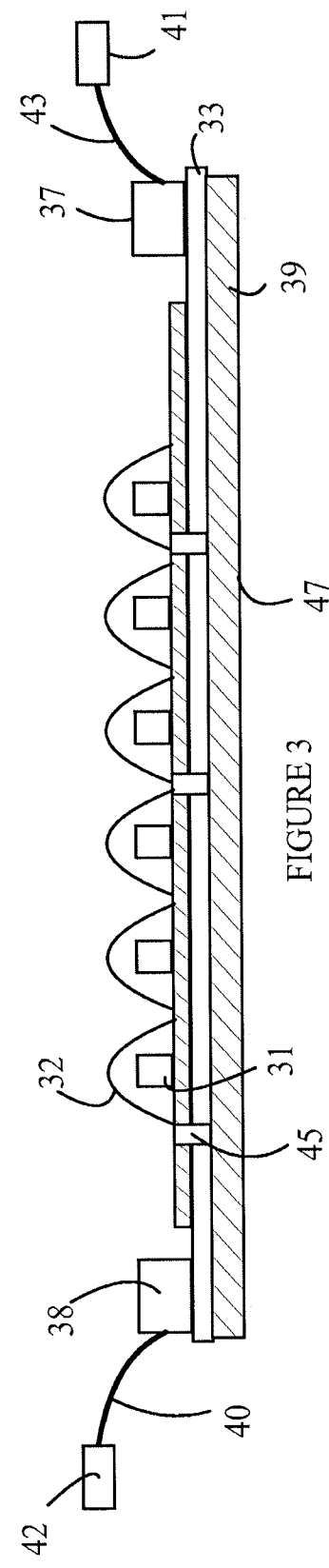

LED-BASED REPLACEMENT FOR FLUORESCENT LIGHT SOURCE

CROSS-REFERENCE TO RELATED APPLICATIONS

This application is a continuation of U.S. patent application Ser. No. 16/195,692, filed Nov. 19, 2018, now U.S. Pat. No. 10,551,008, which is a continuation of U.S. patent application Ser. No. 15/423,529, filed Feb. 2, 2017, now U.S. Pat. No. 10,132,450, which is a continuation of U.S. patent application Ser. No. 14/180,351, filed Feb. 13, 2014, now U.S. Pat. No. 9,599,287, which is a continuation of U.S. patent application Ser. No. 12/888,111, filed Sep. 22, 2010, now U.S. Pat. No. 8,668,361, the disclosures of each of which are hereby incorporated by reference in their entireties.

BACKGROUND OF THE INVENTION

Light emitting diodes (LEDs) are an important class of solid-state devices that convert electric energy to light. Improvements in these devices have resulted in their use in light fixtures designed to replace conventional incandescent and fluorescent light sources. The LEDs have significantly longer lifetimes than both incandescent bulbs and fluorescent tubes. In addition, the efficiency of conversion of electricity to light has now reached the same levels as obtained in fluorescent light fixtures.

In many applications, the cost of replacing a fluorescent tube and disposing of the defective tube is much greater than the cost of the tube itself. In commercial settings, the labor cost inherent in stocking and replacing tubes is high. In addition, the cost of disposal of fluorescent tubes further increases the cost of replacing the tubes, since fluorescent tubes utilize mercury to generate the underlying UV light that is then converted to visible light by the phosphors in the tubes, which are also hazardous materials that present a separate health hazard. Hence, care must be taken in handling the tubes and moving them to the disposal site to prevent breakage and the subsequent release of the toxic materials. Finally, the cost of the tubes themselves over the lifetime of the light fixture is also significant. Thus, there has been some interest in replacing existing fluorescent tubes with LED-based lighting elements.

Converting existing fluorescent fixtures to LED-based light sources presents a number of challenges. Existing fluorescent fixtures typically include an enclosure that holds one or more tubes and a ballast that converts the 50 or 60 cycle building power to the voltages and frequencies utilized by the tubes. A fluorescent tube typically has a startup phase in which a discharge is initiated in the gas. Once the discharge is established, a different voltage is applied to the fluorescent tube to maintain the discharge. The ballast provides the driving voltages and manages the startup phase. The voltages used to start and drive the fluorescent tube are typically AC voltages.

LEDs are typically driven with a DC voltage at a constant current. Hence, an LED light source typically requires a power supply that converts the conventional building power to a DC source that supplies a constant current to the LEDs in the light source. Accordingly, when an existing fluorescent tube light source is converted to an LED-based light source, all of the fluorescent tubes are typically removed and the fluorescent tube ballast is replaced with a LED power source.

This conversion can impose a significant cost and require a significant downtime for the lighting fixtures. The retired fluorescent tubes that are still functioning represent a significant capital investment that is lost when the fixture is replaced. In addition, specialized personnel are needed to remove the old ballast and install the new LED power supply. Accordingly, a switchover to LED-based tube replacements can require a significant level of organization and planning as well as cost.

The electrical conversion efficiency and lifetime of LEDs depend on the operating temperature of the LEDs. Increases in temperature lead to a loss in conversion efficiency and a lowering of the LED lifetime. Transferring the heat from the LEDs to the surrounding air is, hence, an important consideration in replacing existing fluorescent tubes with LED-based light sources. Typically, LED light sources in the power range of existing fluorescent tube light sources require a large heat transfer surface and good air circulation. If the fluorescent tubes are in a closed fixture that has poor air circulation, the transfer of the heat to the air presents additional challenges.

SUMMARY OF THE INVENTION

The present invention includes a light source that is adapted to replace existing fluorescent tubes in an existing fluorescent light fixture. The light source includes a plurality of LEDs mounted on a heat-dissipating structure, first and second plug adapters that mate with the florescent tube connectors of the fluorescent tube the light source is to replace, and a power adapter that converts power from a fluorescent tube ballast presented on the first and second plug adapters to DC power that powers the LEDs. The light source is powered from the output of the existing fluorescent ballast. The light source can utilize the existing metallic enclosure as a heat-radiating surface and/or direct air heat transfer from the surface of the heat-dissipating structure.

BRIEF DESCRIPTION OF THE DRAWINGS

FIGS. 2 and 3 illustrate one embodiment of an LED-based light source that is configured as a replacement for a conventional fluorescent tube.

DETAILED DESCRIPTION OF THE PREFERRED EMBODIMENTS OF THE INVENTION

Figure 1A:
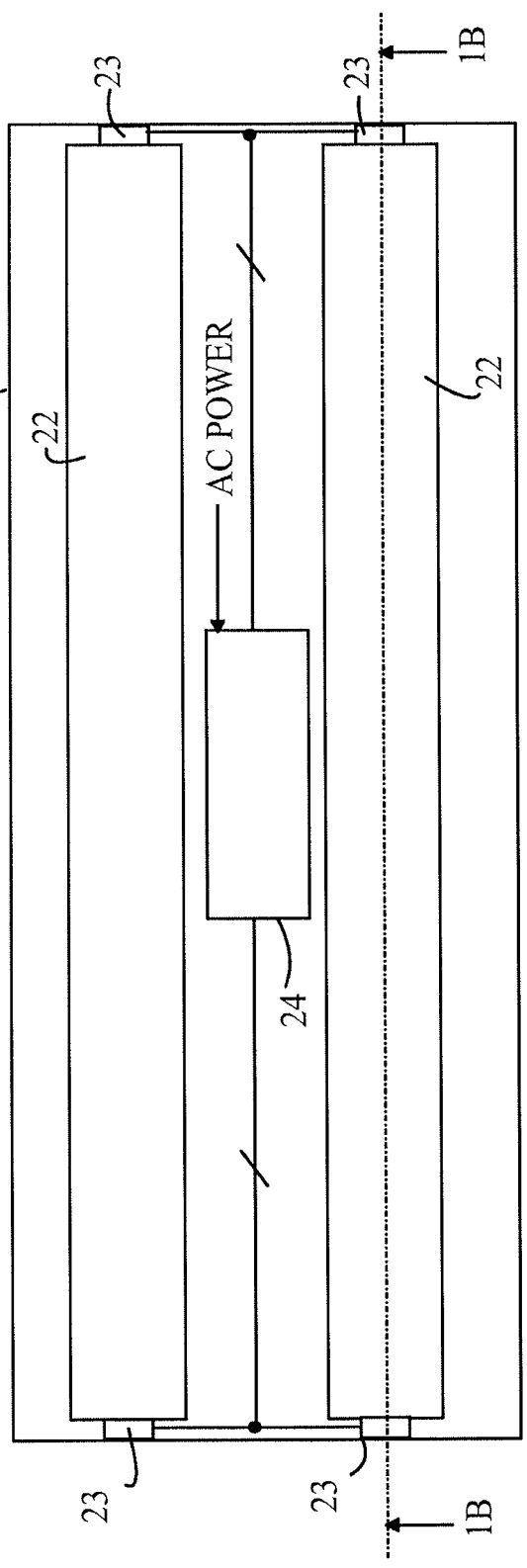
FIG. 1A is a view from underneath a typical prior art fluorescent tube lighting assembly.
Figure 1B:
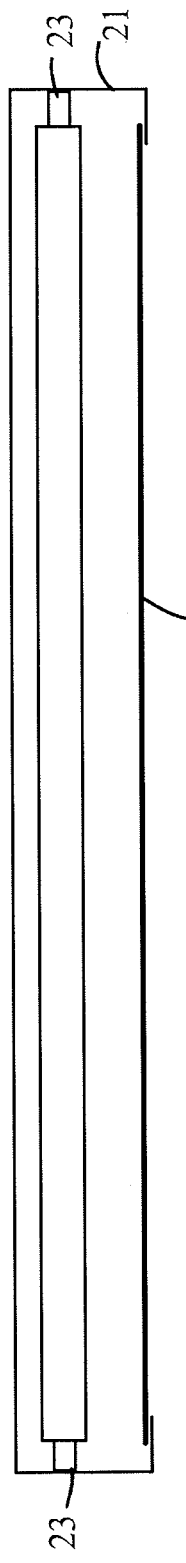
FIG. 1B is a cross-sectional view of lighting assembly 20 through line 1B-1B.

The manner in which the present invention provides its advantages can be more easily understood with reference to FIGS. 1A and 1B. FIG. 1A is a view from underneath a typical prior art fluorescent tube lighting assembly, and FIG.

1B is a cross-sectional view of lighting assembly 20 through line 1B-1B. Light source 20 includes an enclosure 21 that houses two fluorescent tubes shown at 22 and a ballast 24 for powering the fluorescent tubes. Light source 20 also includes a diffuser plate 26 that is not shown in FIG. 1A. The fluorescent tubes are inserted into connectors 23 that are connected to ballast 24 and provide the power for operating the fluorescent tubes.

The specific electrical connections and type of connector utilized depends on the type of fluorescent tube for which light source 20 is designed. For example, some designs utilize fluorescent tubes that have filaments within the tubes that are used for starting the discharge in the tube; while other designs utilize a high voltage startup phase to start the discharge. The first type of fluorescent tube utilizes a connector that mates with two pins on each end of the fluorescent tube. The second type of fluorescent tube has only one pin on each end of the fluorescent tube. The details of the ballast operation will be discussed in more detail below. For the purposes of the present discussion, it is sufficient to note that ballast 24 typically provides a first power pattern used to start the fluorescent tube and a second power pattern used to maintain the discharge during operation.

Conversion systems for converting fluorescent tube lighting to LED lighting are available commercially. In one scheme, the ballast is replaced by a power supply for providing a constant current source to the LEDs. This procedure requires the conversion to be carried out by someone with significantly more expertise than that required to replace a burnt-out fluorescent tube. In addition, the investment in the ballast is lost. In this regard, it should be noted that some of the circuitry in the ballast could, in principle, be utilized to simplify the circuitry needed to construct the constant current source for the LEDs.

Commercial lighting elements based on LEDs that emulate a conventional fluorescent tube are also available. These replacement tubes plug into the same connectors as the fluorescent tubes that they replace after the ballast has been replaced or the ballast has been removed and the connectors wired directly to the AC power lines. Since these replacements have the same form factor as the fluorescent tubes that they replace, heat dissipation presents challenges that significantly increase the cost of the replacements.

The present invention is based on the observation that a replacement LED light source for fluorescent tube 22 should plug into the same connectors and operate from the voltage patterns generated by the ballasts. Such a replacement would permit the conversion from fluorescent tubes to LED light sources to take place gradually as the fluorescent tubes burn out and are replaced. Furthermore, the upgrade could be carried out by the same personnel who are presently employed to change fluorescent tubes when those fluorescent tubes burn out. In addition, as will be discussed in more detail below, the power supply on the LED light source can advantageously use the output waveforms of the ballast for a number of different types of ballasts that are currently in use.

Refer now to FIGS. 2 and 3, which illustrate one embodiment of an LED-based light source that is configured as a replacement for a conventional fluorescent tube. FIG. 2 is a top view of light source 30, and FIG. 3 is a cross-sectional view of light source 30 through line 3-3. Light source 30 is constructed from a plurality of LEDs of which LED 31 is typical. In this embodiment, the dies emit blue light and are covered with a layer of phosphor 32 that converts a portion of the light generated by the corresponding die to light in the yellow region of the spectrum such that the light that leaves the phosphor layer is perceived as being white light of predetermined color temperature by a human observer. In this embodiment, the LEDs are connected in parallel utilizing traces 34 and 35, which are formed on an insulating layer 33. However, embodiments in which the LEDs are connected in series or more complex circuit patterns can also be accommodated. Each LED is also mounted on a heat-dissipating structure 36 that aids in the transfer of the heat generated by the LEDs to the ambient environment. The manner in which the heat is dissipated will be discussed in more detail below.

Traces 33 and 34 are powered from an interface circuit having components shown at 37 and 38. The interface circuit is connected to the connectors used to power the existing fluorescent tube via cables 40 and 43 that have connectors shown at 42 and 41, respectively. Connectors 42 and 41 have ends that match the ends of the fluorescent tube that light source 30 replaces.

As noted above, heat dissipation is an important consideration with high power LED light sources. A T12 or T8 fluorescent tube typically generates 70 to 100 lumens per inch of tube while consuming approximately 0.9 watts of power per inch of tube. Hence, an LED replacement light source needs to generate 70 to 100 lumens per inch of light source. In addition, the LED replacement light source must have a "footprint" that is no wider than the fluorescent tube. Currently, white light sources based on GaN blue emitting LEDs generate 70 to 100 lumens per watt. Hence, the LED replacement source will generate about 1 watt/sec of heat for each inch along the light source to provide a replacement for the higher efficiency fluorescent tubes. If a lower efficiency fluorescent tube is being replaced, the heat that must be dissipated could be as low as 0.5 watts/sec. On the other hand, an LED replacement light source could provide more light than existing fluorescent tubes of the length being replaced, and hence, heat dissipations in excess of 2 watts/sec/inch of fluorescent tube could be required.

This heat needs to be dissipated without raising the temperature of the LEDs beyond the point at which an unacceptable decrease in the electrical conversion efficiency of the LEDs is incurred or a temperature at which the life of the LED is reduced. The operating temperature of the LEDs depends on the power being dissipated in the LEDs, the efficiency with which that heat is transferred to the ambient environment, and the temperature of the ambient environment. Typically, a maximum temperature of 70° C. is the operating limit; however, higher temperatures could be utilized with some LEDs, for example limits of 100° C. or 150° C. could be utilized.

In one aspect of the present invention, the LEDs are distributed on heat-dissipating structure 36 such that the surface area presented by the heat-dissipating structure is sufficient to dissipate a significant fraction of the heat of each LED to the surrounding air without the use of finned heat radiators or direct connections to larger heat-radiating surfaces. In one embodiment, the LEDs are distributed such that the heat generated on heat-dissipating structure 36 is less than 1 watt per square inch of surface area on the top surface of heat-dissipating structure 36. As noted above, this arrangement is well matched to existing fluorescent tubes. It should be noted that T12 fluorescent tubes have a diameter of 1.5 inches; hence, a heat-radiating surface of about 1.5 square inches per inch of fluorescent tube being replaced could be made available. It has been determined experimentally, that if the LEDs are spaced apart along the length of heat-dissipating structure 36, between 0.5 and 1 watt of heat per square inch of surface area can be dissipated without raising the temperature of the LEDs by more than 30° C. above ambient.

Referring to FIG. 3, if additional heat dissipation is required, an additional heat-dissipating surface 47 on the backside of the light source can be utilized. In one aspect of the present invention, light source 30 includes a metallic layer 39 that is separated from heat-dissipating structure 39 by insulating layer 33. In one aspect of the invention, a metal layer is connected to heat-dissipating structure 36 by vertical heat-conducting areas such as the metal filled via shown at 45. In another aspect of the invention, heat-dissipating structure 36 is part of metal layer 39. In this case, insulating layer 33 is absent from the area under heat-dissipating structure 36.

It should be noted that heat-dissipating structure 47 can transfer heat to the air if light source 30 is suspended above the back wall 25 of enclosure 21 shown in FIGS. 1A and 1B. In this case, cables 40 and 41 shown in FIGS. 2 and 3 could be replaced by rigid members such that light source 30 would be suspended within the enclosure in the same manner as the fluorescent tube that it replaces.

Figure 4:
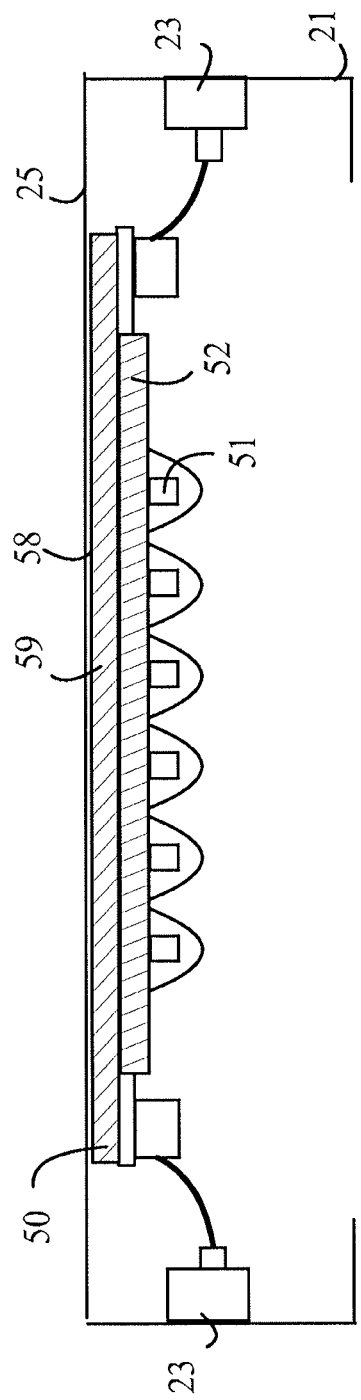
FIG. 4 is a cross-sectional view of another embodiment of a light source according to the present invention mounted against the back wall of enclosure 21 shown in FIGS. 1A and 1B.

However, more effective heat transfer can be provided by mounting light source 30 such that surface 47 is in thermal contact with the back wall of the existing fluorescent tube enclosure. Refer now to FIG. 4, which is a cross-sectional view of another embodiment of a light source according to the present invention mounted against the back wall of enclosure 21 shown in FIGS. 1A and 1B. Light source 50 utilizes a heat-dissipating structure 52 that is pan of heat-dissipating structure 59 and has a sufficient contact area with heat-dissipating structure 59 to assure that the thermal resistance between heat-dissipating structure 52 and heat-dissipating structure 59 is much less than the thermal resistance between the LEDs 51 and heat-dissipating structure 52. Heat-dissipating structure 59 has a surface 58 that is in thermal contact with wall 25 of enclosure 21 when light source 50 is mounted in enclosure 21. The electrical contacts used to power the LEDs are on separate traces on the surface of heat-dissipating structure 52. These traces cover a portion of the surface of heat-dissipating structure 52; however, the fraction of the surface so covered is small compared to the area of heat-dissipating structure 52 that is exposed to the air.

Light source 50 can be attached to surface 25 by a variety of methods. As noted above, one important goal of the present invention is to provide a replacement light source that can be installed by the same person who would normally replace a defective fluorescent tube in the same enclosure. For example, light source 50 could be bolted to surface 25. However, attachment methods that require that the new light source be bolted to enclosure 21 are not preferred, since such schemes can require that new holes be drilled in enclosure 21.

Light source 50 could also be supplied with a heat-conducting adhesive that is applied prior to making the attachment of light source 50 to surface 25. The adhesive is applied over a significant area, and hence, the thermal resistance of the adhesive is less of an issue. To simplify the attachment, light source 50 could be supplied with the adhesive already applied to surface 58 and protected by a peal-off strip. While this method can be practiced by low-skilled personnel, the method presents problems if the light source must be removed at a future date due to failure or the desire to further upgrade the light source. In addition, the coefficient of thermal expansion of the material from which heat-dissipating structure 59 is constructed will, in general, be different from that of the material from which enclosure 21 is constructed; hence, the thermal cycling of the light source can weaken the attachment bond over time leading to a bond failure or loss of thermal conductivity when gaps form between surfaces 25 and 58.

In one aspect of the present invention, the attachment mechanism makes use of the observation that existing enclosures are often constructed from steel. Hence, if heat-dissipating structure 59 is constructed from a material that is magnetized, such as iron, light source 50 can be attached magnetically to surface 25. In another aspect of the invention, a heat-conducting grease is applied to surface 59 to assure good thermal contact between the two surfaces. This grease also facilitates the movement of light source 50 on surface 25 during the positioning of light source 50 on the surface. Since the surface area of enclosure 21 is much greater than the area available on the heat-dissipating surface of the replacement light source, considerably higher power dissipation levels can be accommodated. As a result, a replacement light source that is significantly brighter than the fluorescent tube being replaced can be provided.

In one aspect of the present invention, the replacement LED light source has a plurality of LEDs mounted on a heat-dissipating substrate that has a width that is less than or equal to the diameter of the fluorescent tube that the light source is designed to replace. The substrates are metal clad printed circuit hoards in which the metal cladding provides the heat-radiating surface. The LEDs are mounted in a spaced apart arrangement such that the heat generated on any 1 square inch section of the substrate is less than a predetermined design power value that depends on the manner in which the substrate dissipates the heat to the surrounding environment. The goal of the LED placement is to provide sufficient heat dissipation to limit the temperature of the LEDs to less than 75° C. above ambient.

Refer again to FIG. 2. For example, if the substrate has a heat-radiating surface that dissipates the heat to the surrounding air such as the surface of heat-dissipating structure 36, the present invention limits the LED density such that the heat generated on each square inch of heat-dissipating surface is less than 2 watts and preferably less than 1 watt; while accommodating LEDs that dissipate at least 0.5 watts of heat per second. It should be noted that the relative sizes of heat-dissipating structure 36 and traces 33 and 34 are not shown to scale. In practice, the width of heat-dissipating structure 36 is substantially equal to the width of the light source. Hence, if LEDs having a power dissipation of 1.5 watts each are mounted at one inch spacing on heat-dissipating structure 36 and heat-dissipating structure 36 is 1.5 inches wide, each LED will be surrounded by an area of 1.5 square inches of heat-dissipating surface. This maintains the power density at a level of 1 watt per square inch.

If the heat-dissipating surface is increased by utilizing the surface 47 shown in FIG. 3 in addition to the surface of heat-dissipating structure 36 then the density of LEDs can be increased further. For example, if light source 30 were mounted such that air circulated on both sides of light source 30, this additional surface area could be utilized to dissipate heat thereby doubling the power density on the substrate.

Finally, if the arrangement shown in FIG. 4 is utilized, then the effective heat-dissipating surface is still greater. The effective size depends on the thermal resistance between surfaces 25 and 58. In this regard, it should be noted that enclosure 21 is often painted. The paint layer limits the thermal conductance of the interface between surfaces 25 and 58.

The above-described embodiments of the present invention have utilized a design requirement that the temperature rise of the LEDs is held to less than 75° C. over ambient. However, embodiments in which the design criterion is greater or less than this amount could also be utilized. For example, the replacement light sources could be constructed such that the maximum increase in temperature over ambient is 20° C., 30° C., 40° C., 50° C., 60° C., or 70° C.

Figure 5:
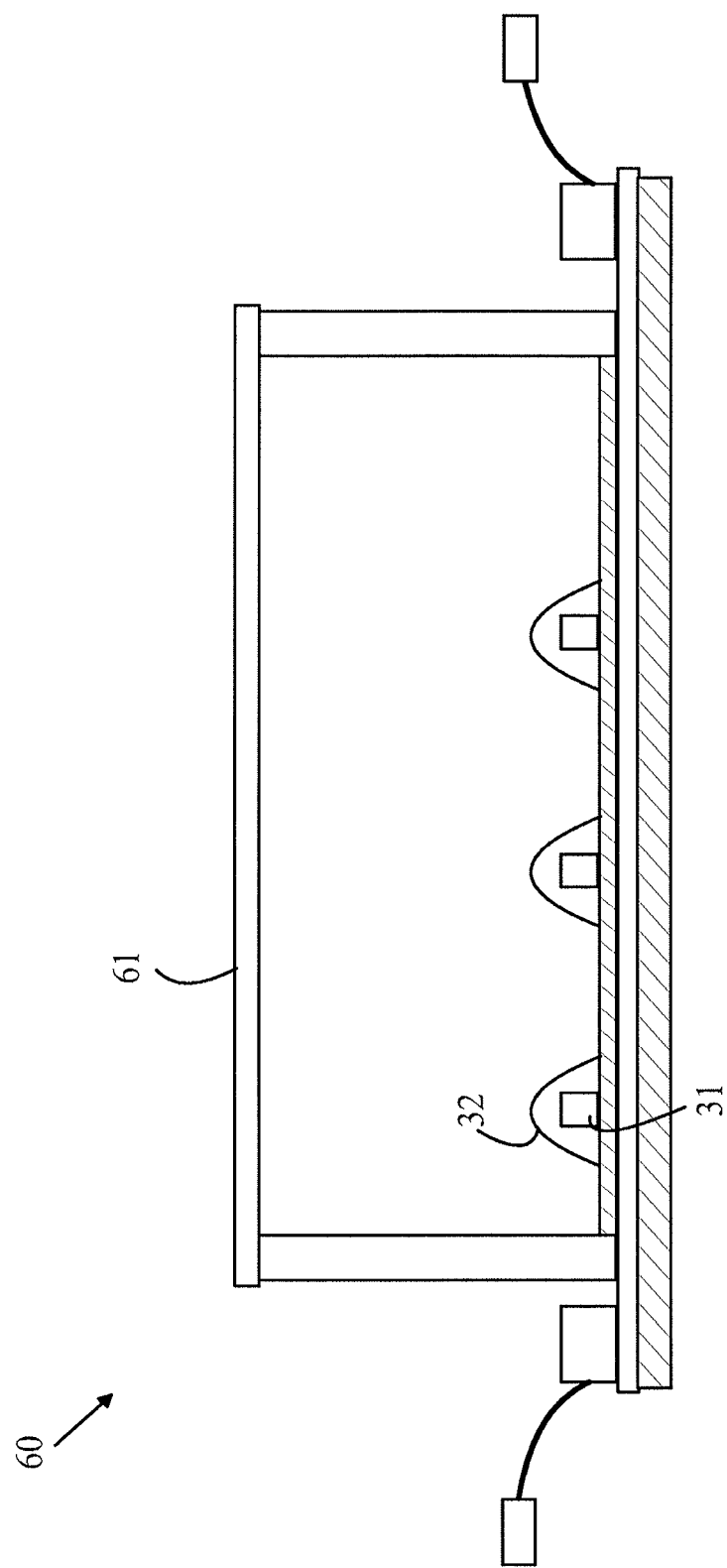
FIG. 5 is a cross-sectional view of another embodiment of a light source according to the present invention.

Typically, the LED dies are of order 1 to 2 mm and dissipate between 1 and 2 watts. In one aspect of the present invention, the dies are mounted directly on the heat-dissipating structure, as opposed to mounting packaged LED dies on the heat-dissipating structure. In one aspect of the present invention, the dies are separated by one to two inches on the light source and the width of the heat-radiating surface is chosen such that the area surrounding each die has sufficient surface area radiating heat to the environment to assure that the temperature of the die remains less than 75° C. above ambient when the die is powered. Even with the phosphor layer over the dies, the light source appears to be discrete point emitters from the point of view of an observer in the area illuminated by the final light source. Fluorescent tubes, in contrast, are broad linear sources. Hence, in some applications, additional optics may be necessary to give the appearance of a fluorescent tube-like light source. Since the individual LEDs are of order 2 or 3 mm, a cylindrical lens that is located one or two inches above the LEDs can transform the collection of point sources into a linear source that is collimated or that diverges at a predetermined angle. Such an arrangement is shown in FIG. 5, which is a cross-sectional view of another embodiment of a light source according to the present invention. In light source 60 a cylindrical lens 61 is mounted above the LEDs. It should be noted that most fluorescent tube enclosures have a depth of a few inches, since the enclosures must accommodate fluorescent tubes that are typically 1.5 inches in diameter. Hence, the LEDs appear as point sources at the lens.

Alternatively, the diffuser 26 shown in FIG. 1B could be replaced by a diffuser having a cylindrical lens stamped on the diffuser. This arrangement, however, requires the user to change the diffuser, and forecloses the user from changing a single fluorescent tube and leaving the remaining tubes in place until they fail.

The above-described embodiments of the present invention utilize a power adapter system that connects to the existing fluorescent tube connectors in the light fixture and powers the LEDs on the light source. Consider a lighting fixture that has 4 fluorescent tubes powered from a common ballast. This light fixture could be converted to LED-based lighting by replacing all of the fluorescent tubes at once and changing the ballast to one that accepts AC and outputs DC of the desired voltage and current to run the LEDs. However, as noted above, this operation requires a skilled tradesman. Alternatively, the fluorescent tubes could be replaced as they fail. Each time a fluorescent tube fails, the individual who is normally responsible for replacing dead tubes would replace the dead tube with a light source according to the present invention. When all of the fluorescent tubes have finally been replaced, the existing ballast could, in principle, also be replaced to provide higher overall power conversion efficiency.

In one aspect of the present invention, the power adapters shown at 37 and 38 in FIG. 2 convert the output of the fluorescent tube ballast to DC having the desired voltage and current needed to drive the LED light source. The remaining fluorescent tubes in the enclosure still receive the same power as before; hence, these fluorescent tubes do not need to be replaced until they fail. The form of the power adapter depends to some degree on the type of ballast that is employed in the light fixture at the start of the conversion process. However, in general, there is a startup phase in which the ballast applies signals needed to initiate the discharge in the tube and a maintenance phase in which the voltage pattern across the fluorescent tube is maintained at level that allows the discharge to continue. In one aspect of the present invention, the power adapters present loads to the fluorescent tube ballast at startup that mimic the current flows associated with the fluorescent tube having started while protecting the LEDs from any high voltages used in the startup phase. Once, the ballast switches to the maintenance voltage, the power adapters convert the AC voltage associated with this phase of operation to DC at the voltage and current required by the LED light source.

The AC output of conventional ballasts is either at the AC line frequency or an AC signal at frequencies in excess of 20 KHz, and preferably greater than 42 KHz. Older ballast designs utilize the line frequency. More modern "digital." ballasts utilize the high frequency output. Converting the high frequency output to DC with the desired characteristics, in general, requires small components and is more economical. However, either output voltage can be accommodated.

Figure 6:
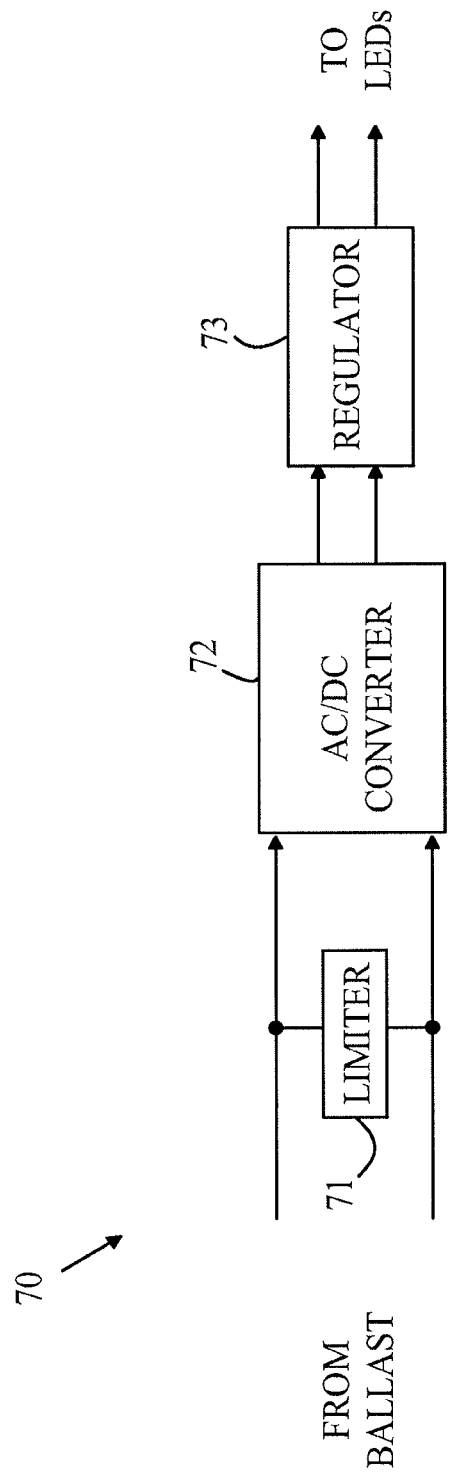
FIG. 6 illustrates one embodiment of a power adapter according to the present invention.

There are two general types of pin arrangements in fluorescent tubes. One type has one pin at each end and is run by applying the AC output of the ballast across those pins. To start the fluorescent tube, a higher voltage is initially applied across the tube until the discharge starts or some predetermined time has elapsed. Refer now to FIG. 6, which illustrates one embodiment of a power adapter according to the present invention. Power adapter 70 is designed to adapt the output of a cold start ballast of the type used to power two-pin fluorescent tubes. A limiter 71 limits the starting voltage to prevent damage to AC/DC converter 72 and presents a load to the ballast that mimics the current drawn when the corresponding fluorescent tube starts. AC/DC converter 72 converts the AC generated by the ballast to a DC voltage that can be used by regulator 73 to generate a constant current power supply to power the LEDs.

Figure 7:
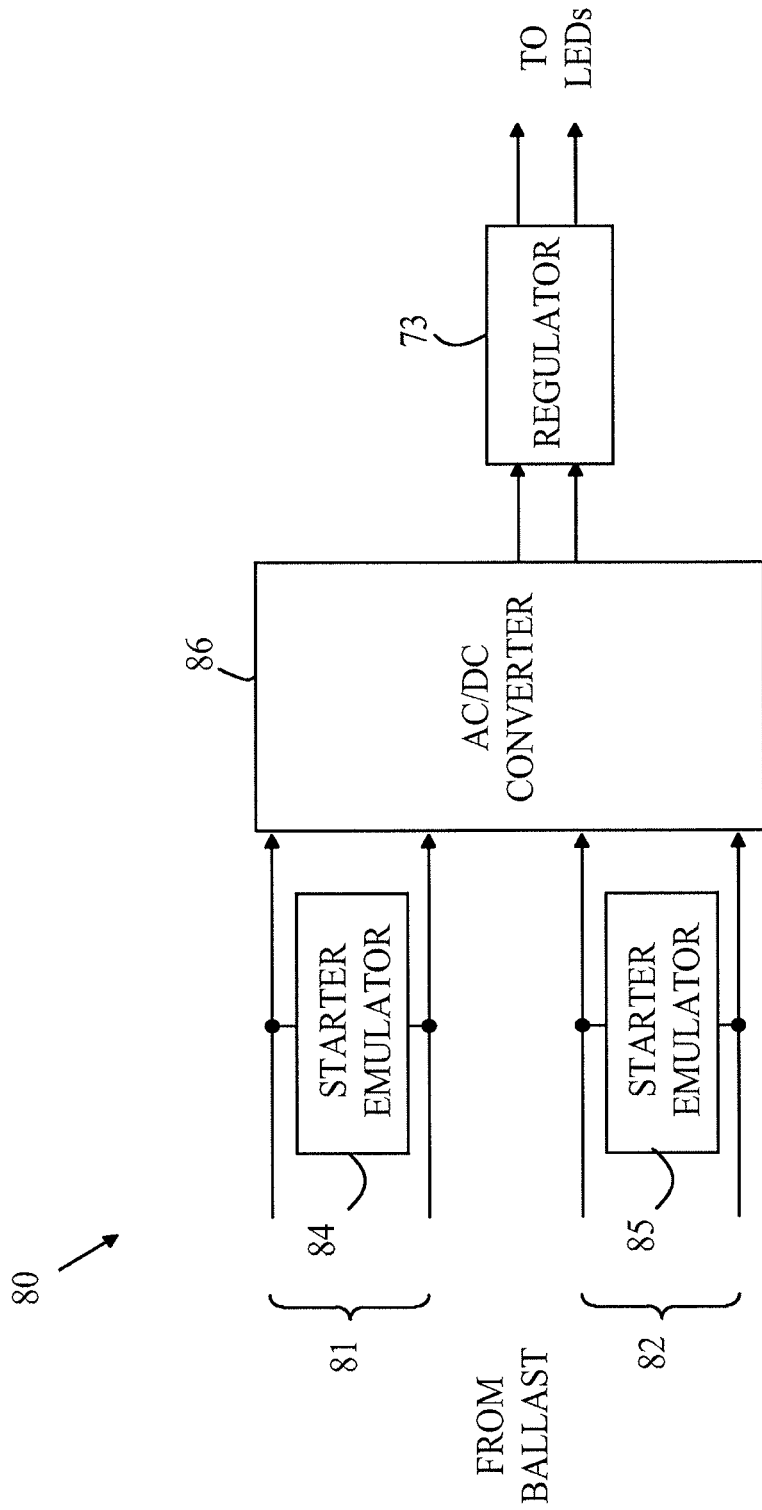
FIG. 7 illustrates another embodiment of a power adapter according to the present invention.

The second type of pin arrangement consists of two pins at each end of the tube. Tubes of this type have some form of startup mode in which a current between the pins on the ends of the tube heats the gas or otherwise facilitates the initial gas breakdown prior to applying the discharge maintenance potential across one pin on each end of the tube. In this arrangement, the power adapter must mimic a tube that is starting up in terms of the power drain and loads across the pins at each end. Once the ballast perceives that the fluorescent tube has started, the two pins on each end of the fluorescent tube are driven with the same AC voltage to maintain the discharge. In this mode, the power adapter needs to rectify the supplied power in a manner to that analogous to that discussed above. Refer now to FIG. 7, which illustrates another embodiment of a power adapter according to the present invention. Power adapter 80 operates with a 4-pin ballast that supplies separate power to the fluorescent tube's starter circuitry. The two pins 81 from one fluorescent tube connector power a starter emulator 84 that presents a load that mimics the starter circuit in the fluorescent tube for which the ballast was designed. Similarly, the two pins 82 from the other fluorescent tube connector power a second starter emulator 85. Once the ballast supplies the fluorescent tube driving voltage on one pin from the set of pins shown at 81 and one pin from the set of pins shown at 82, AC/DC converter 86 rectifies this AC signal and provides the DC power to regulator 73.

As noted above, once all of the tubes in a light fixture have been replaced with LED-based alternatives, it may be advantageous to replace the old ballast with an AC/DC converter that is more power efficient than the combination of the old ballast and the power adapters in the LED-based light sources. If the old ballast is merely replaced, the input to the LED-based light sources will switch to a DC voltage that is typically much less than the amplitude of the AC voltages supplied by the ballast. In the case of a 4-wire output ballast, both pins in set 81 will be connected together, and both pins in set 82 will also be connected together. In one aspect of the present invention, the AC/DC converters used in power adapters 70 and 80 include a sensor that determines if the input to those converters is AC or DC. If the input is DC, the converter merely connects the DC lines to the power regulator. It should be noted the startup circuit emulators will, in general, not be activated by the lower DC voltages supplied by the new ballast.

Figure 8:
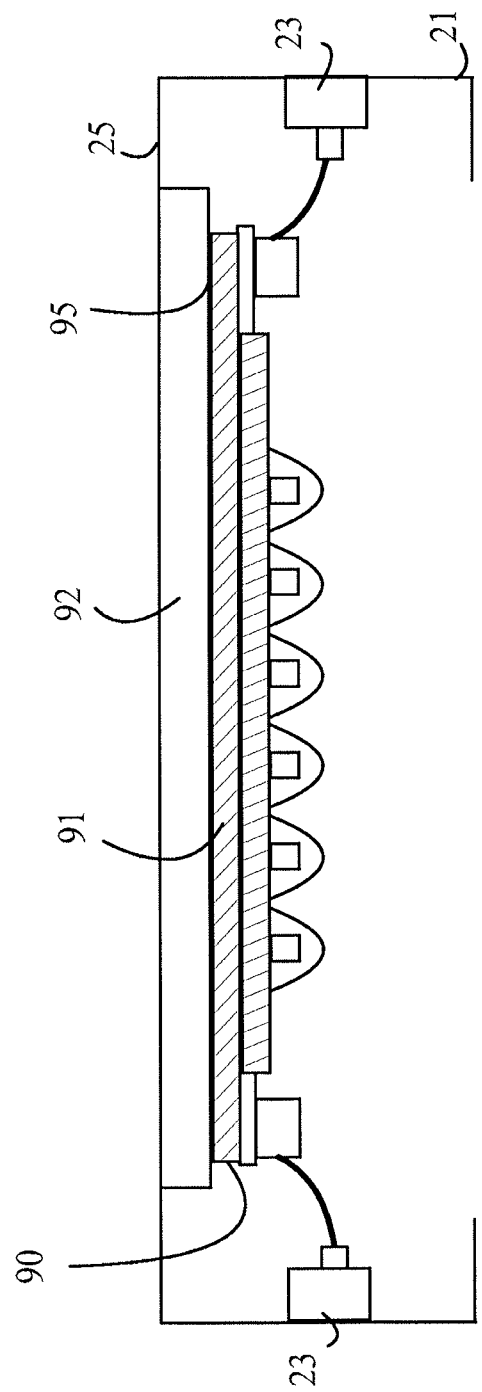
FIG. 8 is a cross-sectional view of another embodiment of a light source according to the present invention.

In the embodiments discussed above with reference to FIG. 4, one of the heat-dissipating surfaces was a magnet that provided an attachment mechanism and a heat path to a surface of the enclosure in which the light source is mounted. It should be noted that it is sufficient for structure 59 shown in FIG. 4 to be ferromagnetic to provide the benefits discussed above. Refer now to FIG. 8, which is a cross-sectional view of another embodiment of a light source according to the present invention. Light source 90 includes a heat-dissipating structure 91 that is in thermal communication with the LEDs. Structure 91 includes a ferromagnetic material such as iron or nickel. A separate magnet 92 is interposed between surface 95 and structure 91, Hence, structure 91 does not need to be a magnet; it is sufficient for structure 91 to have sufficient ferromagnetic material to assure that structure 91 binds to magnet 92 with sufficient force to hold light source 90 in place.

In the above-described embodiments, the light sources utilize individual LEDs that are distributed on the surface of the heat-dissipating structure. However, small clusters of LEDs could also be utilized provided the local heat generated is less than the power that would cause the area to increase in temperature to an unacceptable level.

The above-described embodiments of the present invention have been provided to illustrate various aspects of the invention. However, it is to be understood that different aspects of the present invention that are shown in different specific embodiments can be combined to provide other embodiments of the present invention. In addition, various modifications to the present invention will become apparent from the foregoing description and accompanying drawings. Accordingly, the present invention is to be limited solely by the scope of the following claims.

What is claimed is:

1. A light source comprising:
a heat-dissipating structure having a first surface, wherein the heat-dissipating structure comprises metal and the first surface is in contact with air having an ambient temperature; and
a plurality of light emitting diodes (LEDs) mounted on the first surface of the heat-dissipating structure,
wherein the plurality of LEDs are distributed in respective positions on the heat-dissipating structure, such that a surface area presented by the heat-dissipating structure is configured to dissipate heat generated by each the plurality of LEDs to surrounding air without using a finned heat radiator or being directly connected to an additional heat-radiating surface.

2. The light source of claim 1, wherein the plurality of LEDs are configured to generate less than 2 watts per second of heat on any square inch of the first surface of the heat-dissipating structure during operation of the plurality of LEDs.

3. The light source of claim 2, further comprising an additional metallic surface disposed on a second surface of the heat-dissipating structure opposite the first surface and in thermal communication with the metallic surface on the first surface, such that the additional metallic surface is configured to dissipate additional heat from the metallic surface on the first surface.

4. The light source of claim 3, wherein the additional metallic surface comprises a magnetized ferromagnetic material.

5. The light source of claim 3, further comprising:
an insulating layer disposed between the respective metallic surfaces; and
at least one via extending through the insulating layer to thermally couple the respective metallic surfaces.

6. The light source of claim 1, wherein the first surface of the heat-dissipating structure is a metallic surface.

7. The light source of claim 1, wherein the plurality of LEDs are each spaced a distance apart from each other sufficient to maintain an operating temperature of less than 75° C. above the ambient temperature of the air during operation of the plurality of LEDs.

8. The light source of claim 1, wherein the plurality of LEDs are mounted directly on the first surface of the heat-dissipating structure.

9. The light source of claim 1, wherein the plurality of LEDs are configured to emit light from the light source in a direction normal to the first surface of the heat-dissipating structure during operation of the plurality of LEDs.

10. The light source of claim 1, further comprising:
first and second plug adapters configured to mate with a fluorescent tube connector; and
a power adapter configured to convert power from a fluorescent tube ballast presented on the first and second plug adapters to DC power that powers the plurality of LEDs.

11. The light source of claim 10, wherein the fluorescent tube ballast is configured to provide power in a first mode that starts a conventional fluorescent tube of a predetermined type and switch to provide power in a second mode that powers the conventional tube in a maintenance phase of operation.

12. The light source of claim 11, wherein the power adapter is configured to present a load to the fluorescent tube ballast in the first mode, with the presented load mimicking a load that would be provided by the fluorescent tube when said fluorescent tube commences opera.

13. A light source comprising:
a heat-dissipating structure having first and second opposing metallic surfaces in thermal communication with each other; and
a plurality of light emitting diodes (LEDs) mounted on the first metallic surface of the heat-dissipating structure, with the plurality of LEDs being distributed in respective positions on the heat-dissipating structure, such that a surface area presented by the heat-dissipating structure is configured to dissipate heat generated by each the plurality of LEDs to surrounding air without using a finned heat radiator or being directly connected to an additional heat-radiating surface.

14. The light source of claim 13, wherein the plurality of LEDs are configured to generate less than 2 watts per second of heat on any square inch of the first metallic surface during operation of the plurality of LEDs.

15. The light source of claim 13, wherein the first metallic surface is in contact with air having an ambient temperature and the plurality of LEDs are each spaced a distance apart from each other sufficient to maintain an operating temperature of less than 75° C. above the ambient temperature of the air during operation of the plurality of LEDs.

16. The light source of claim 13, wherein the plurality of LEDs are mounted directly on the first metallic surface of the heat-dissipating structure.

17. The light source of claim 13, wherein the second metallic surface comprises a magnetized ferromagnetic material.

18. The light source of claim 13, further comprising:
an insulating layer disposed between the first and second metallic surfaces; and
at least one via extending through the insulating layer to thermally couple the first and second metallic surfaces.

19. The light source of claim 13, wherein the plurality of LEDs are configured to emit light from the light source in a direction normal to the first metallic surface of the heat-dissipating structure during operation of the plurality of LEDs.

20. The light source of claim 13, further comprising:
first and second plug adapters configured to mate with a fluorescent tube connector; and
a power adapter configured to convert power from a fluorescent tube ballast presented on the first and second plug adapters to DC power that powers the plurality of LEDs.

21. The light source of claim 20, wherein the fluorescent tube ballast is configured to provide power in a first mode that starts a conventional fluorescent tube of a predetermined type and switch to provide power in a second mode that powers the conventional tube in a maintenance phase of operation.

22. The light source of claim 21, wherein the power adapter is configured to present a load to the fluorescent tube ballast in the first mode, with the presented load mimicking a load that would be provided by the fluorescent tube when said fluorescent tube commences operation.

23. A light source comprising:
a heat-dissipating structure having a first surface; and
a plurality of light emitting diodes (LEDs) mounted on the first surface of the heat-dissipating structure,
wherein the plurality of LEDs are mounted directly on the first surface of the heat-dissipating structure, and
wherein the plurality of LEDs are distributed in respective positions on the heat-dissipating structure, such that a surface area presented by the heat-dissipating structure is configured to dissipate heat generated by each the plurality of LEDs to surrounding air without using a finned heat radiator or being directly connected to an additional heat-radiating surface.

* * * * *

UNITED STATES PATENT AND TRADEMARK OFFICE
CERTIFICATE OF CORRECTION

PATENT NO. : 11,428,371 B2
APPLICATION NO. : 16/779447
DATED : August 30, 2022
INVENTOR(S) : Ghulam Hasnain et al.

It is certified that error appears in the above-identified patent and that said Letters Patent is hereby corrected as shown below:

On the Title Page

Under (*) Notice please add the following:
-- This patent is subject to a Terminal Disclaimer. --

Signed and Sealed this
Eighteenth Day of October, 2022

Katherine Kelly Vidal
*Director of the United States Patent and Trademark Office*